United States Patent
Uekawa

(10) Patent No.: US 6,486,485 B1
(45) Date of Patent: Nov. 26, 2002

(54) OPTOCOUPLER HAVING NORMALLY-ON DRIVING ELEMENT

(75) Inventor: Kazuya Uekawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 10 days.

(21) Appl. No.: 09/689,607

(22) Filed: Oct. 13, 2000

(30) Foreign Application Priority Data

Oct. 15, 1999 (JP) ............................................. 11-294625

(51) Int. Cl.$^7$ ............................................... G02B 27/00
(52) U.S. Cl. ........................ 250/551; 250/216; 327/514
(58) Field of Search ................................. 250/551, 216, 250/214 R; 327/514, 455, 438–442, 445–446; 307/112, 116, 117; 323/319, 325, 349, 350, 351

(56) References Cited

U.S. PATENT DOCUMENTS

| 3,812,382 A | * | 5/1974 | Pascente | 327/451 |
| 3,932,770 A | * | 1/1976 | Fantozzi | 307/117 |
| 4,129,785 A | * | 12/1978 | Kadah | 250/551 |
| 4,419,586 A | * | 12/1983 | Phipps | 250/551 |
| 4,745,311 A | * | 5/1988 | Iwasaki | 307/632 |
| 5,182,456 A | * | 1/1993 | Beezley | 250/551 |
| 5,216,303 A | * | 6/1993 | Lu | 307/113 |
| 5,338,991 A | * | 8/1994 | Lu | 327/455 |
| 5,708,277 A | | 1/1998 | Murayama et al. | 250/551 |
| 6,323,718 B1 | * | 11/2001 | Rault et al. | 327/438 |

FOREIGN PATENT DOCUMENTS

| JP | 61247079 | | 11/1986 |
| JP | 01158821 A | * | 6/1989 |
| JP | 9321545 | | 12/1997 |

* cited by examiner

Primary Examiner—Kevin Pyo
Assistant Examiner—Seung C. Sohn
(74) Attorney, Agent, or Firm—Birch, Stewart, Kolasch & Birch, LLP

(57) ABSTRACT

An optocoupler having a driving traic and at least one normally-on driving element couple in series to the driving triac. A light emitting element turns on the driving triac at a time when a phase of a load current is at about 0°. The normally-on driving element is composed of either a MOSFET, or optionally a relay, and an associated element for turning off MOSFET, or relay, at a time when a phase of the load current is about 90°. The arrangement prevents an inrush current or commutation failure, and provides an optocoupler which can be turned off with prescribed timing. Alternative embodiments are disclosed for an optocoupler that can turn itself off when an abnormality occurs, for example, when an ambient temperature rises to an extremely high level.

11 Claims, 12 Drawing Sheets

OPTOCOUPLER HAVING NORMALLY-ON DRIVING ELEMENT

BACKGROUND OF THE INVENTION

1. Field of the Invention

The present invention relates to an optocoupler such as a solid-state relay, etc., and more particularly to an optocoupler capable of controlling an off-state thereof with a prescribed timing.

2. Description of the Related Art

A conventional solid-state relay 900, as illustrated in FIG. 9, has a structure including: a light emitting element 901 (generally, a GaAs LED or a GaAlAs LED) which converts an electric signal into a light: a light receiving element 902 (generally, a phototriac) which converts a light into an electric signal; a driving triac 903 which is coupled to the light receiving element 902: and a resistance element 904. The driving triac 903 is also coupled to a load 905.

When an input current is applied to the light emitting element 901, the light receiving element 902 is activated and the light receiving element 902 drives the driving triac 903 so that the driving triac 903 is switched over to an on-state.

Once the triac 903 is turned on, even if the input current is turned off immediately afterward, the driving triac 903 maintains the on-state until a load current flowing therethrough reaches a zero value (which is a basic operation of solid-state relays).

One method for activating the solid-state relay 900 involves phase control. As illustrated in FIG. 10A, phase control is realized by adjusting the timing of turning on the driving triac 903 based on the timing of applying the input current, thereby controlling the load current. Arbitrary control of the load current is generally possible depending on the application timing of the input current (FIGS. 10A, 10B and 10C).

Now, consider the case where the load 905 must be activated with a half amount of electric power (FIG. 10B) as compared to that required for a full-phase on-driving mode. Activating the load 905 with the half amount of electric power in comparison to that of the full-phase on-driving mode may be achieved by setting the timing of the input current application, as illustrated in FIG. 10B, so as to occur at phase angles of 90° and 270° of a load current waveform.

As illustrated in FIG. 11, when the input current is applied, the load current is at a peak. Thus, a substantial inrush current may flow into the solid-state relay 900 immediately after the input current is applied, depending on the type of the load 905, thereby adversely affecting the solid-state relay 900.

Once the driving triac 903 is turned on, even if the input current is turned off immediately afterward, the driving triac 903 maintains an on-state until the load current flowing therethrough reaches a zero value. is As illustrated in FIG. 12, especially in the case of a load which gives rise to a load current whose phase is shifted with respect to the phase of a supply voltage, e.g., an inductive load, a steep voltage is applied to the triac 903 as the triac 903 is turned off. Accordingly, there is a possibility that commutation failure may occur.

As described above, the solid-state relay 900 has characteristics such that once the driving triac 903 is turned on, the driving triac 903 maintains the on-state until the load current flowing therethrough reaches a zero value. Therefore, the problems described above may arise depending on the application timing of the input current or the type of the load.

The conventional solid-state relay 900 is not provided with a function of compulsorily turning off the triac 903 when the ambient temperature rises to an extremely high level. At present. the product safety Is sought more than ever. Accordingly, it is desired that any solid-state relay be provided with a function of turning itself off when any abnormality occurs.

As described above, the solid-state relay 900 has characteristics such that once the driving triac 903 is turned on, the driving triac 903 maintains the on-state until the load current flowing therethrough reaches a zero value. Therefore problems such as an increase in the inrush current, commutation failure, etc., may arise depending on the application timing of the input current, the type of the load, etc.

SUMMARY OF THE INVENTION

An optocoupler of the present invention includes a driving triac and at least one normally-on driving element coupled in series to the driving triac, thereby accomplishing objects of the present invention.

The optocoupler may be a solid-state relay.

The driving element may include a MOSFET.

The driving element may include a mechanical relay.

A timing of turning off the driving element may be synchronized with a phase point substantially corresponding to 0 V level of a supply voltage on an output side of the optocoupler.

The driving element may include a light emitting element for controlling the MOSFET. The optocoupler may further include a temperature detecting means coupled to the light emitting element.

The driving element may further include a light emitting element for controlling the MOSFET. The optocoupler may further include a resistance element coupled in series to the light emitting element and the resistance element may have a negative temperature coefficient.

The driving element may further include a first light emitting element for controlling the MOSFET. The optocoupler may include a second light emitting element corresponding to the driving triac and an integrated circuit coupled to the first light emitting element and the second light emitting element. The integrated circuit may have a delay function.

There may be more than one driving triac.

According to one aspect of the present invention, when a solid-state relay is turned on, an input current is applied to a light emitting diode so as to activate a driving triac. When the solid-state relay is turned off afterward, a trigger pulse is applied to a normally-on driving element. Therefore, it is possible to prescribe the timing for turning off, as well as turning on, the solid-state relay.

According to another aspect of the present invention, when the solid-state relay is turned on, an input current is applied to a light emitting diode associated with the light receiving element/driving triac, so as to activate the driving triac. When the solid state relay is turned off afterward at a predetermined time, an input current is applied to the light emitting diode associated with the MOSFET so as to turn off the normally-on MOSFET. Therefore, it is possible to prescribe the timing for turning off, as well as turning on, the solid-state relay.

According to still another aspect of the present invention, when the solid-state relay is turned on, an input current is applied to a light emitting diode so as to activate the driving triac. When the solid-state relay is turned off afterward at a predetermined time, a trigger pulse is applied to a normally-on mechanical relay. Therefore, it is possible to prescribe the timing for turning off, as well as turning on, the solid-state relay.

According to still another aspect of the present invention, it is possible to prevent a steep voltage from being applied to the solid-state relay in the off-state. Accordingly, it is possible to prevent commutation failure from occurring.

According to still another aspect of the invention, by preconditioning the solid-state relay so,that an input current will flow into the light emitting diode (which controls the MOSFET) when an abnormality occurs, e.g., an ambient temperature rises to an extremely high level, the normally-on MOSFET is turned off, thereby compulsorily turning off the device. Accordingly, it is possible to prevent an abnormal operation of the device at high temperatures, for example.

According to still another aspect of the present invention, by preconditioning the solid-state relay so that an input current sufficient to turn off the normally-on MOSFET will flow into the light emitting diode (which controls the MOSFET) by reducing a-resistance value of the resistance element having a negative temperature coefficient when an abnormality occurs, e.g., an ambient temperature rises to an extremely high level, the normally-on MOSFET is turned off, thereby compulsorily turning off the device. Accordingly, it is possible to prevent an abnormal operation of the device at high temperatures, for example.

According to still another aspect of the present invention, when a phase control is performed, the solid-state relay can maintain a stable on state during the time delay provided by an integrated circuit. Accordingly, It is possible to facilitate the design of the device by using the integrated circuit.

According to still another aspect of the present Invention, there is provided an optocoupler which is characterized by including a plurality of normally-on driving elements coupled in series to a driving triac.

For example, as shown in FIG. 7, two normally-on driving elements 105 may be coupled in series to the driving triac 103. In this case, one of the normally-on driving elements 105 may be dedicated to the "off-controlling" of the device (the term "off-controlling" as used herein refers to controlling of an off-state of a device, i.e., turning off a device) and the other may be dedicated to the compulsory shutting off of the device operation when the device is abnormally heated, for example.

As a result, it is possible to realize a device which is capable of being controlled so as to be on/off with a predetermined timing and, moreover, it is possible to compulsorily turn of f the solid-state relay 700 when the solid-state relay 700 is abnormally heated, for example.

Effects of the present invention will be described below.

According to the present invention, there is provided an optocoupler such as a solid-state relay, etc., which can not only be turned on, but also turned off with a predetermined timing. As a result, even in the case of driving the load with a prescribed electric power, it is possible to prescribe the timings of turning on/off the solid-state relay for minimizing an inrush current and preventing commutation failure by adjusting such prescribed timings of turning on/off while performing phase control.

Moreover, when an abnormality occurs, e.g., an ambient temperature rises to an extremely high level, it is possible to compulsorily turn off the device, thereby preventing an abnormal operation of the device when the device is heated, for example.

Thus, the invention described herein makes possible the advantages of: (1) providing an optocoupler capable of preventing an increase in an inrush current or commutation failure; (2) providing an optocoupler which can be turned off with a prescribed timing; and (3) providing an optocoupler capable of compulsorily turning itself off when any abnormality occurs, e.g., when an ambient temperature rises to an extremely high level.

These and other advantages of the present invention will become apparent to those skilled in the art upon reading and understanding the following detailed description with reference to the accompanying figures.

DESCRIPTION OF THE PREFERRED EMBODIMENTS

Figure 1:
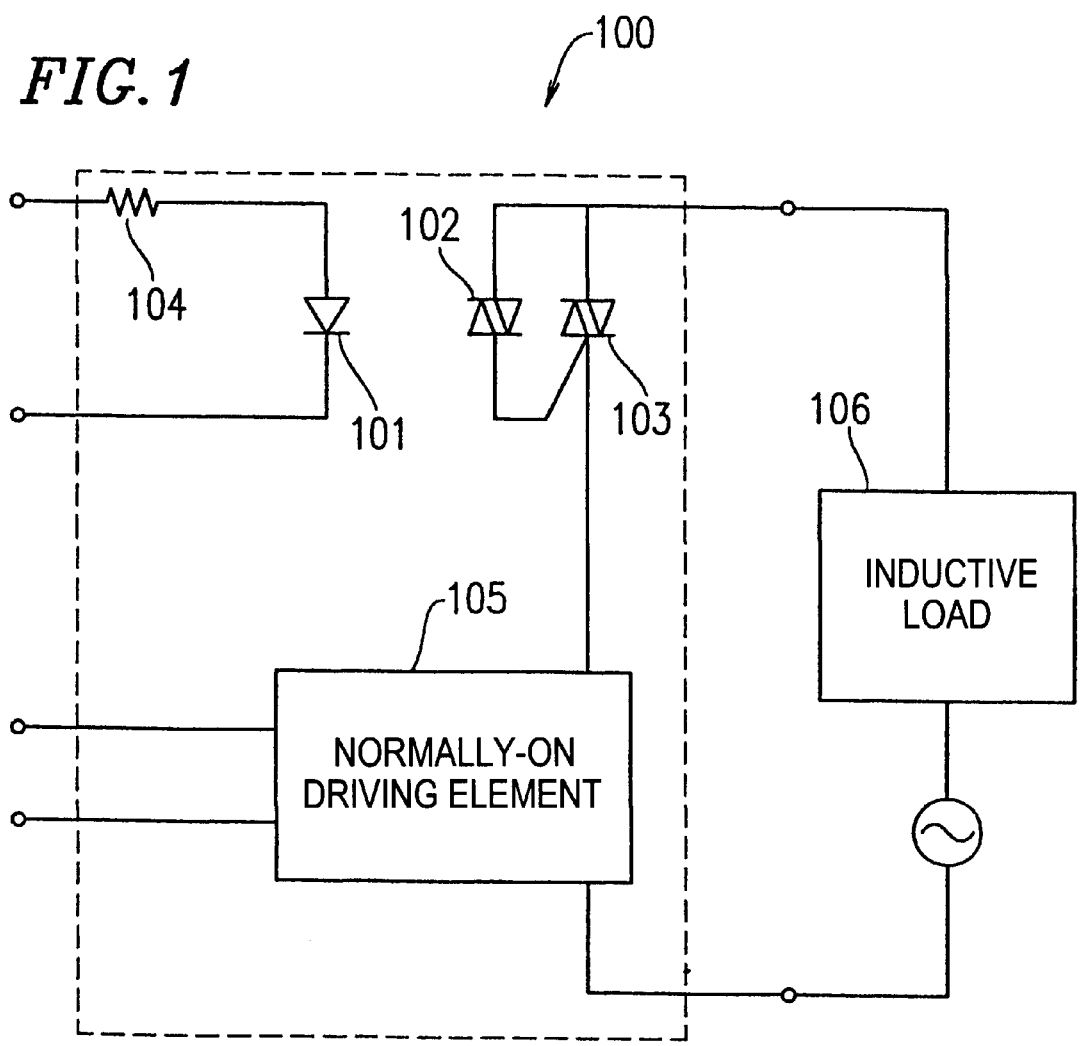
FIG. 1 is a circuit diagram of a solid-state relay according to an embodiment of the present invention wherein a normally-on driving element is coupled in series to a driving triac.

A solid-state relay 100 according to an embodiment of the present Invention is illustrated in FIG. 1. The solid-state relay 100 includes: a light emitting diode 101: a light receiving element (phototriac) 102: a driving triac 103; a resistance 104: and a normally-on driving element 105 coupled in series to the driving triac 103.

Figure 8A:
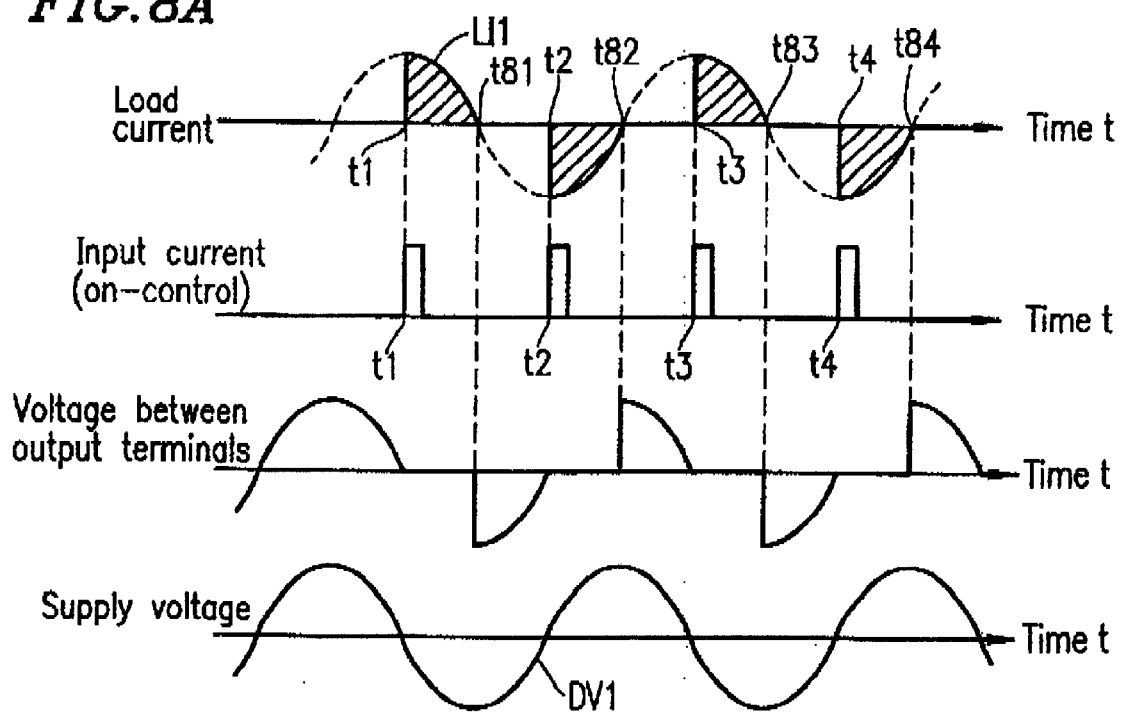
FIGS. 8A and 8B are graphs illustrating phase-controlled waveforms of a solid-state relay, according to an embodiment of the present invention, capable of preventing at increase in an inrush current and a commutation failure when a load is activated in a phase control mode.
Figure 9:
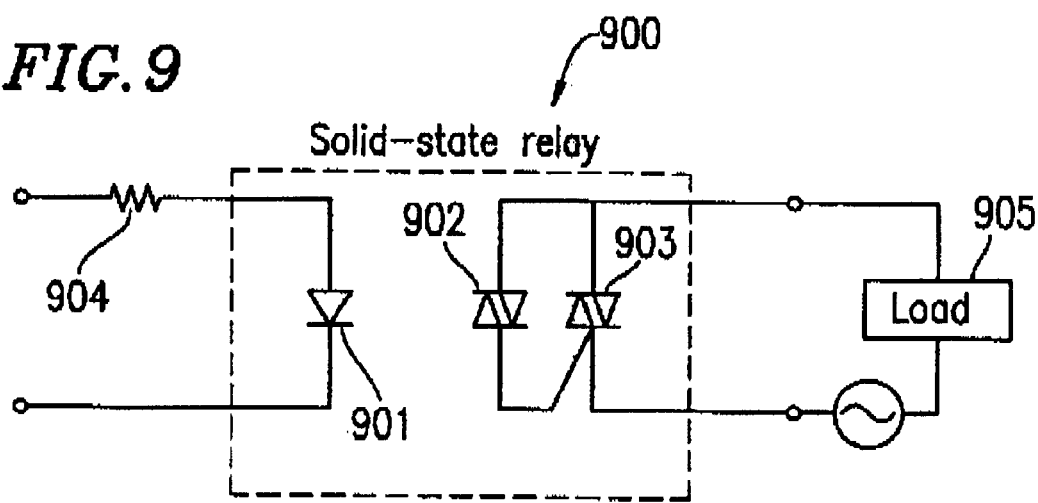
FIG. 9 is a structural diagram of a conventional solid-state relay.
Figure 10A:
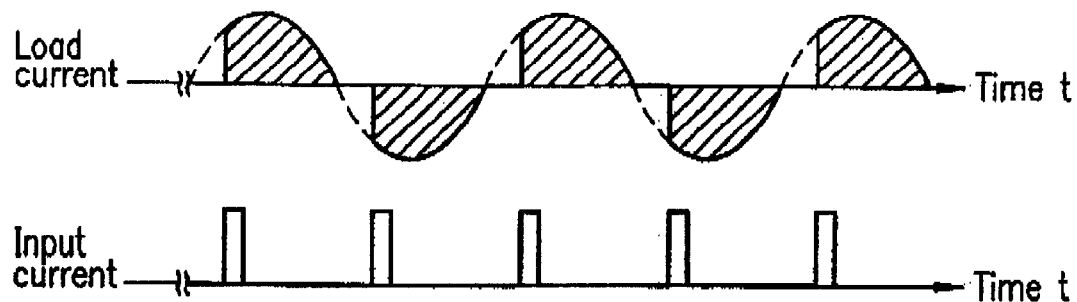
FIGS. 10A, 10B and 10C are graphs illustrating phase-controlled waveforms of a conventional solid-state relay.
Figure 10B:
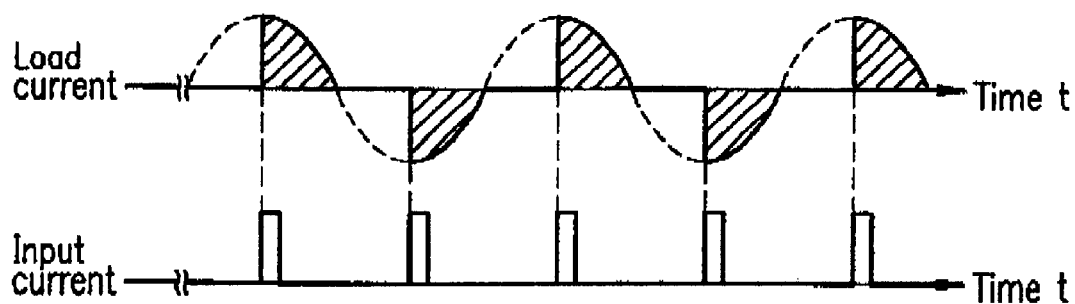
Figure 10C:
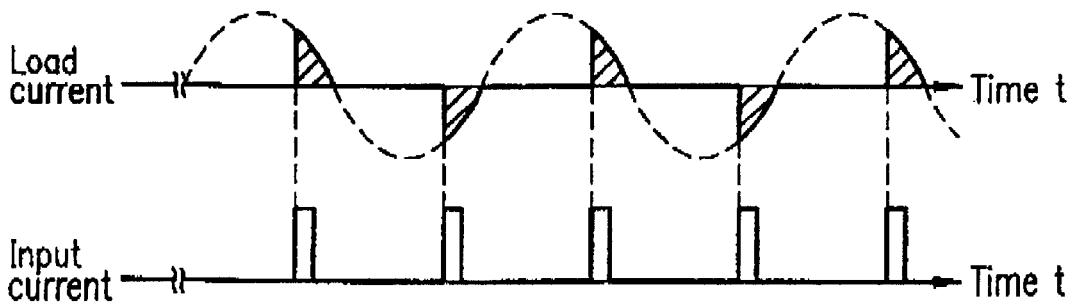
Figure 11:
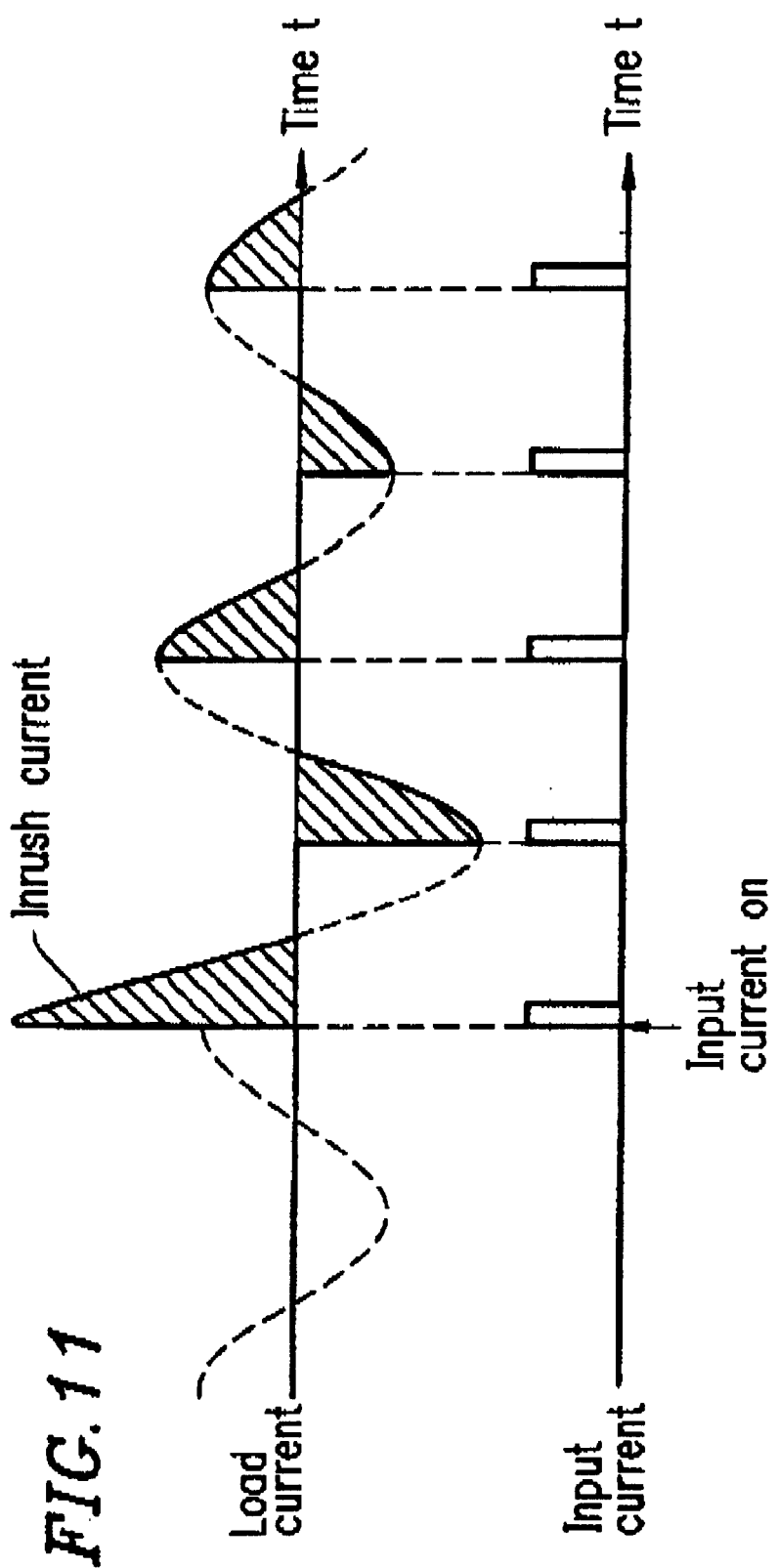
FIG. 11 is a graph illustrating an inrush current waveform in a phase control mode of a conventional solid-state relay.
Figure 12:
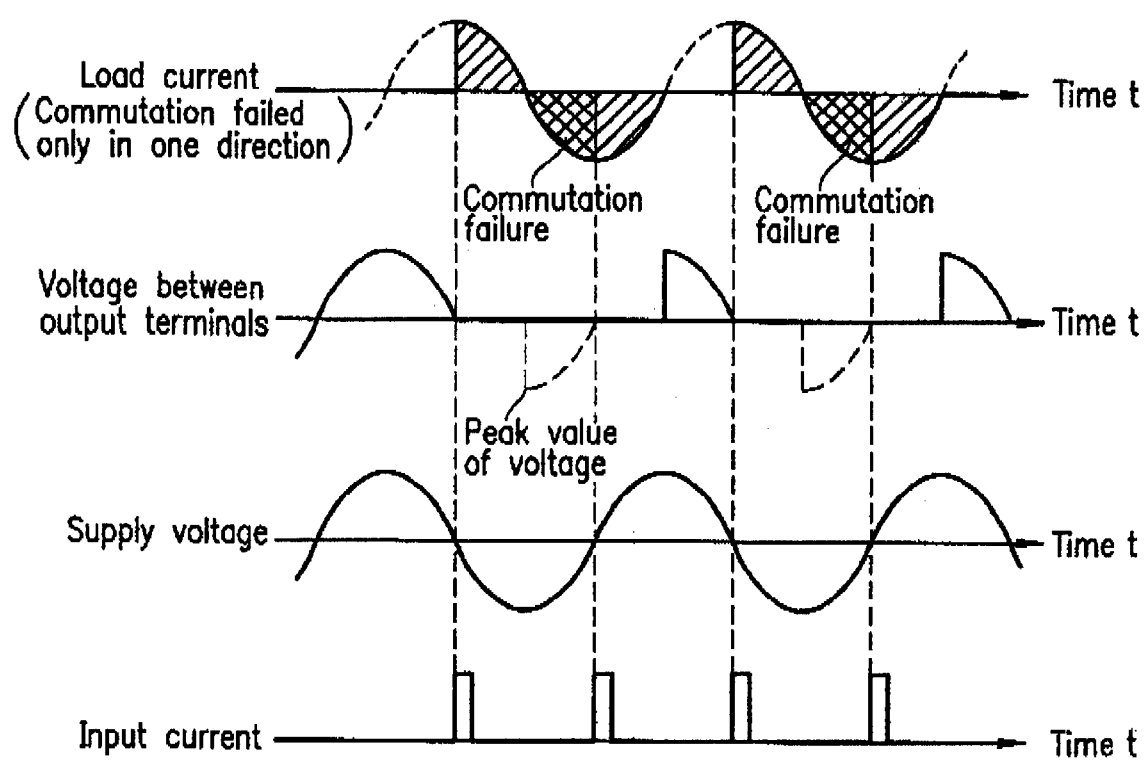
FIG. 12 is a graph illustrating a commutation failure waveform of a conventional solid-state relay.

Now, a case will be considered in which, an inductive load 106 which gives rise to a load current whose phase is shifted substantially by 90° with respect to a supply voltage is coupled to the solid-state relay 100, the load being driven with an electric power which is half of that required in a full-phase on-driving mode, First, phase control which may be performed in a conventional solid-state relay 900 (FIG. 9) will be described. As illustrated in FIG. 8A, input currents are applied to a light emitting element 902 at respective times t1, t2, t3 and t4 approximately corresponding to 90° phase points of a current waveform, so as to activate the solid-state relay 900.

A load current LI1 approximately has its peak values at times t1, t2, t3 and t4. Accordingly, a substantial inrush current may occur at each of these times, thereby adversely affecting the device. Moreover, a supply voltage DV1 approximately has its peak values at the off-points, i.e., at t81, t82, t83 and t84, so that a commutation failure may be caused in the solid-state relay 900 due to its (dv/dt)c characteristics.

Figure 8B:
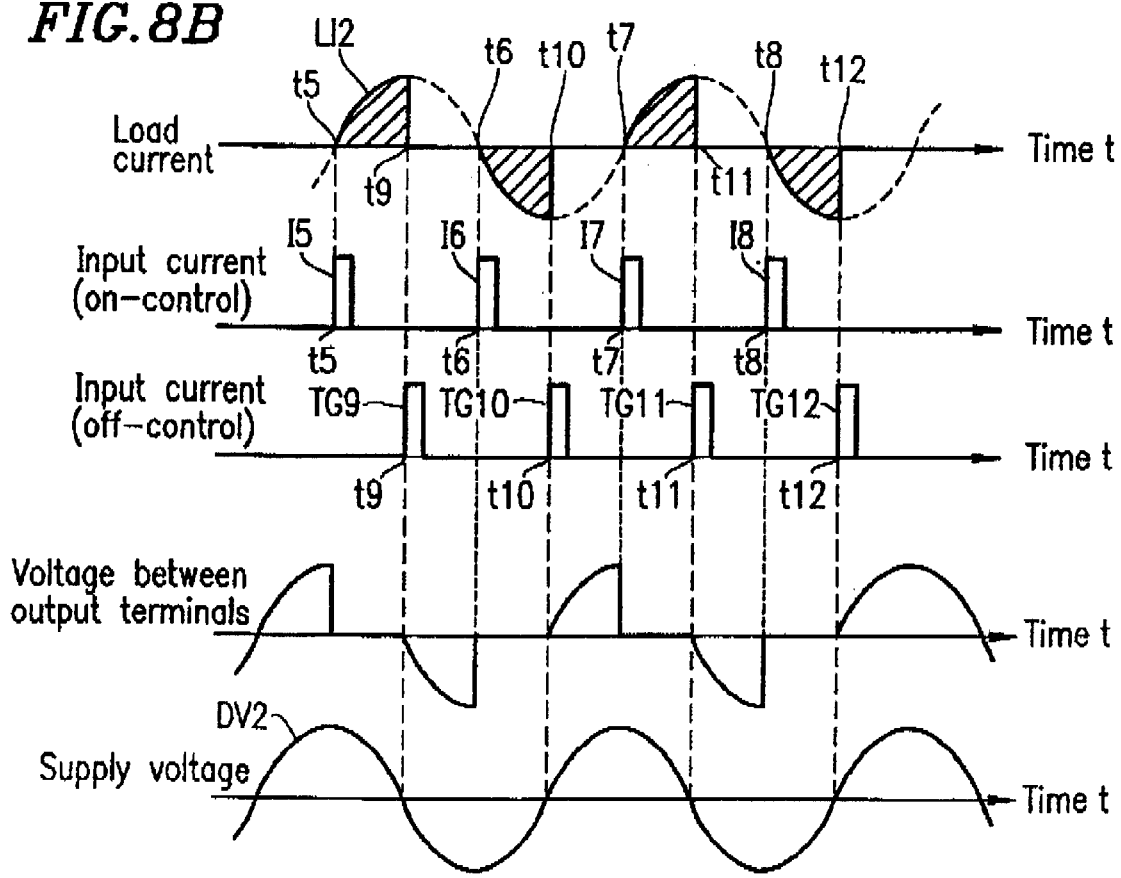

Next, referring to FIG. 8B, an operation of the solid-state relay 100 (FIG. 1) according to an embodiment of the present invention will be described, in which the load 106 is activated with a half amount of electric power in comparison to that of a full-phase on-driving mode.

It is assumed that input current pulses I5, I6, I7 and I8 for turning on the driving triac 103 are applied to the light emitting diode 101 at times t5, t6, t7 and t8, respectively, approximately corresponding to 0° phase points of the load current phase and that trigger pulses TG9, TG10 TG11 and TG12 for turning off the normally-on driving element 105 are applied to the normally-on driving element 105 at times t9, t10, t11 and t12, respectively, approximately corresponding to 90° phase points.

Under such conditions, an inrush current can be prevented since the phase of a load current LI2 in the on-states, i.e., at times t5, t6, t7 and t8. is approximately at 0°. Moreover, the phase of a supply voltage DV2 is approximately at 0° in the off-states, i.e., at times t9, t10, t11 and t12. Thus, no steep overvoltage is applied to the device, thereby preventing commutation failures.

Therefore, since the solid-state relay 100 is capable of turning itself off with a predetermined timing, it is possible to achieve a stable operation of the load 106.

Figure 2:
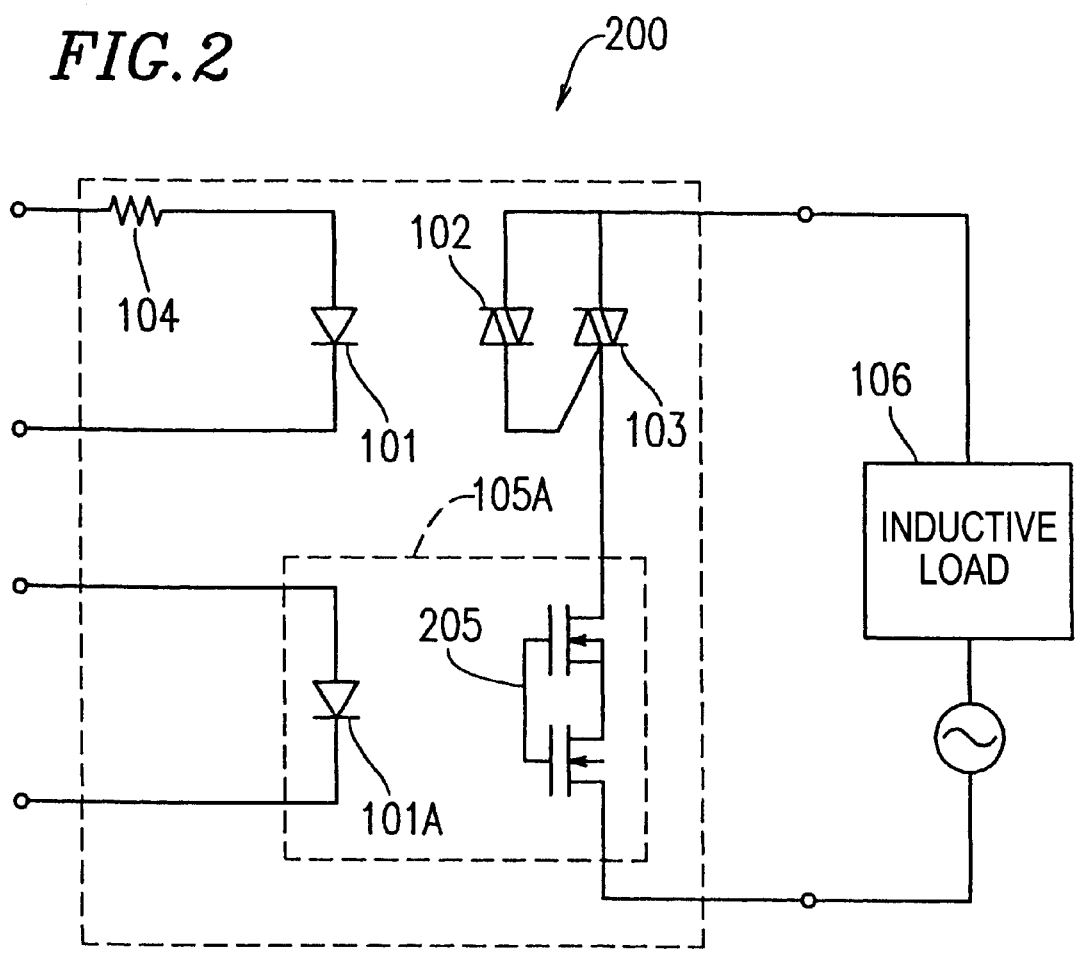
FIG. 2 is a structural diagram of a solid-state relay according to an embodiment of the present invention wherein a normally-on driving element is a MOSFET.

FIG. 2 illustrates a structure of a solid-state relay 200 according to an embodiment of the present invention in which a normally-on driving element 105A includes a MOSFET 205. Like reference numerals to those of the solid-state relay 100 according to the previous embodiment of the present invention discussed with reference to FIG. 1 denote like elements in the present embodiment, and will not be further described below.

The normally-on driving element 105A, which is coupled in series to a driving triac 103, includes a light emitting diode 101A and the normally-on MOSFET 205.

When the solid-state relay 200 is turned on, an input current is applied to a light emitting diode 101 associated with a light receiving element 102/driving triac 103 so as to activate the driving triac 103. When the solid-state relay 200 is turned off afterward at a predetermined time, an input current is applied to the light emitting diode 101A associated with the MOSFET 205 so as to turn off the normally-on MOSFET 205.

Therefore, it is possible to prescribe the timing for turning off, as well as turning on, the solid-state relay 200.

Figure 3:
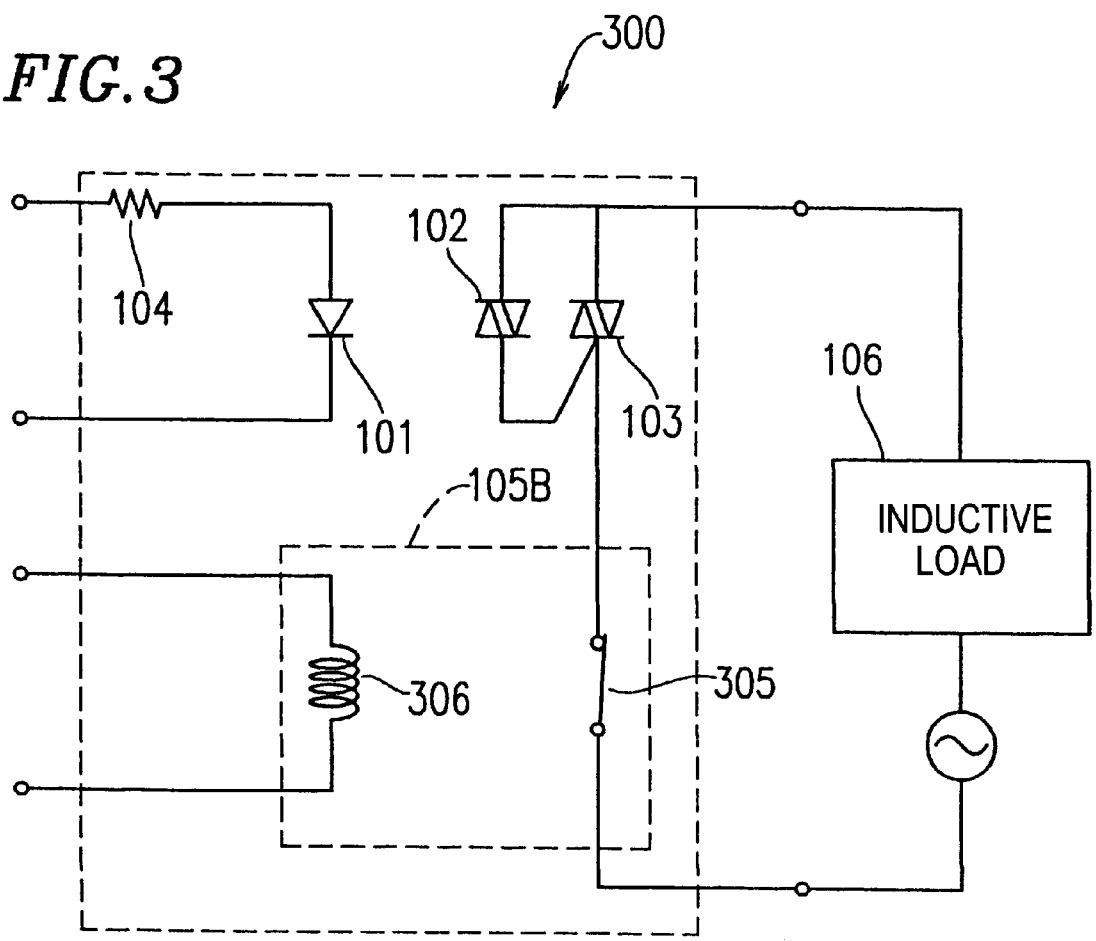
FIG. 3 is a structural diagram of a solid-state relay according to an embodiment of the present invention wherein a normally-on driving element is a mechanical relay.

FIG. 3 illustrates a structure of a solid-state relay 300 according to an embodiment of the present invention in which a normally-on driving element 105B is a mechanical relay. Like reference numerals to those of the solid-state relay 100 according to an embodiment of the present invention previously discussed with regard to FIG. 1 denote like elements, and will not further be described below.

The normally-on driving element 105B coupled in series to a driving triac 103 includes a normally-on mechanical relay 305.

When the solid-state relay 300 is turned on, an input current is applied to a light emitting diode 101 so as to activate the driving triac 103. When the solid-state relay 300 is turned off afterward at a predetermined time, a trigger pulse is applied to the normally-on mechanical relay 305, that is, an input current is applied to a coil 306 so as to turn off the normally-on mechanical relay 305.

Therefore, it is possible to prescribe the timing for turning off, as well as turning on, the solid-state relay 300.

Figure 4:
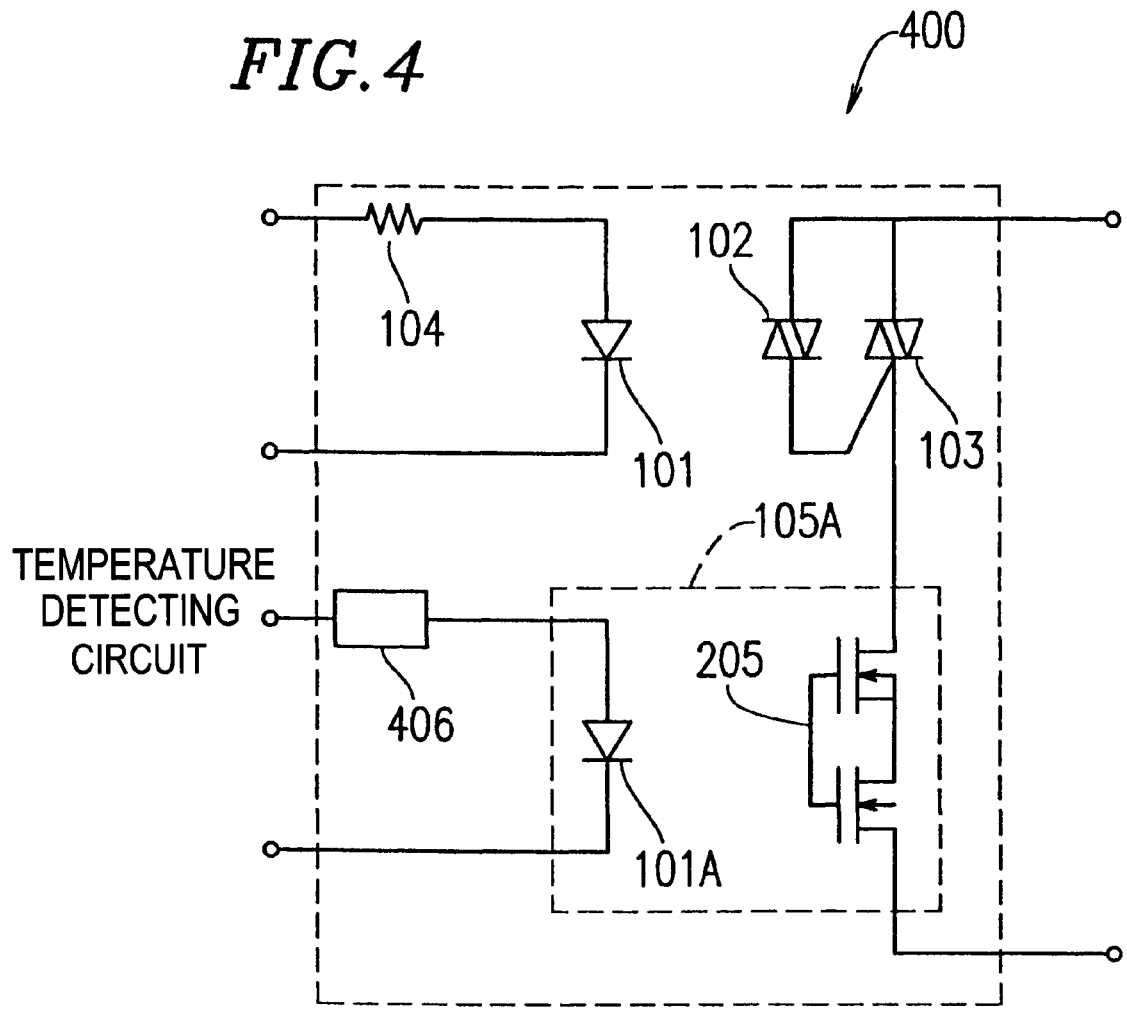
FIG. 4 is a structural diagram of a solid-state relay according to an embodiment of the present invention wherein a temperature detecting circuit is provided in association with a light emitting diode which controls a MOSFET.

FIG. 4 illustrates a structure of a solid-state relay 400 according to an embodiment of the present invention in which a temperature detecting circuit 406 is provided associated with a light emitting diode 101A which controls a normally-on MOSFET 205. Like reference numerals to those of the solid-state relay 100 according to the previous embodiment of the present invention discussed with regard to FIG. 1 denote like elements in the present embodiments, and will not be further described below.

A normally-on driving element 105A, which is coupled in series to a driving triac 103, includes the light emitting diode 101A and the normally-on MOSFET 205. The light emitting diode 101A controls the MOSFET 205.

The solid-state relay 400 further includes the temperature detecting circuit 406 coupled in series to the light emitting diode 101A.

By preconditioning the solid-state relay 400 so that an input current will flow into the light emitting diode 101A (which controls the normally-on, MOSFET 205) when an abnormality occurs, e.g., an ambient temperature rises to an extremely high level, the normally-on MOSFET 205 is turned off, thereby compulsorily turning off the solid-state relay 400. Accordingly, it is possible to prevent an abnormal operation of the solid-state relay 400 at high temperatures, for example.

Figure 5:
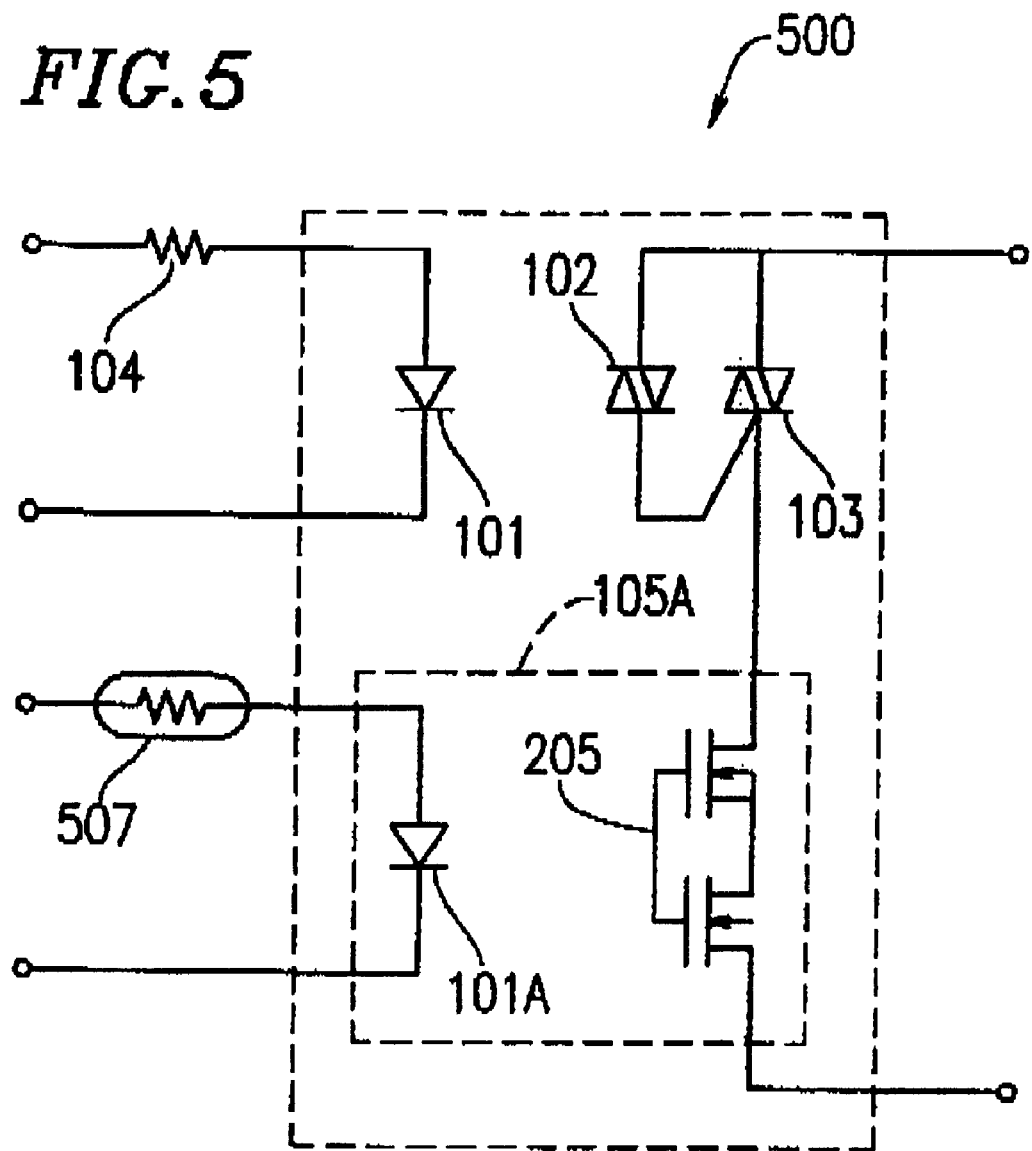
FIG. 5 is a structural diagram of a solid-state relay according to an embodiment of the present invention wherein a resistance element having a negative temperature coefficient is coupled in series to a light emitting diode.

FIG. 5 illustrates a structure of a solid-state relay 500 according to an embodiment of the present invention, in which a resistance element 507 having a negative temperature coefficient is coupled in series to a light emitting diode 101A.

A normally-on driving element 105A coupled in series to a driving triac 103 includes the light emitting diode 101A and a normally-on MOSFET 205. The light emitting diode 101A controls the normally-on MOSFET 205.

The solid-state relay 500 further includes the resistance element 507 coupled in series to the light emitting diode 101A. The resistance element 507 has a negative temperature coefficient.

By preconditioning the solid-state relay 500 so that an input current sufficient to turn off the normally-on MOSFET 205 will flow into the light emitting diode 101A (which controls the normally-on MOSFET 205) by reducing a resistance value of the resistance element 507 having a negative temperature coefficient when an abnormality occurs, e.g., an ambient temperature rises to an extremely high level, the normally-on MOSFET 205 is turned off, thereby compulsorily turning off the solid-state relay 500. Accordingly, it is possible to prevent an abnormal operation of the solid-state relay 500 at high temperatures, for example.

Figure 6:
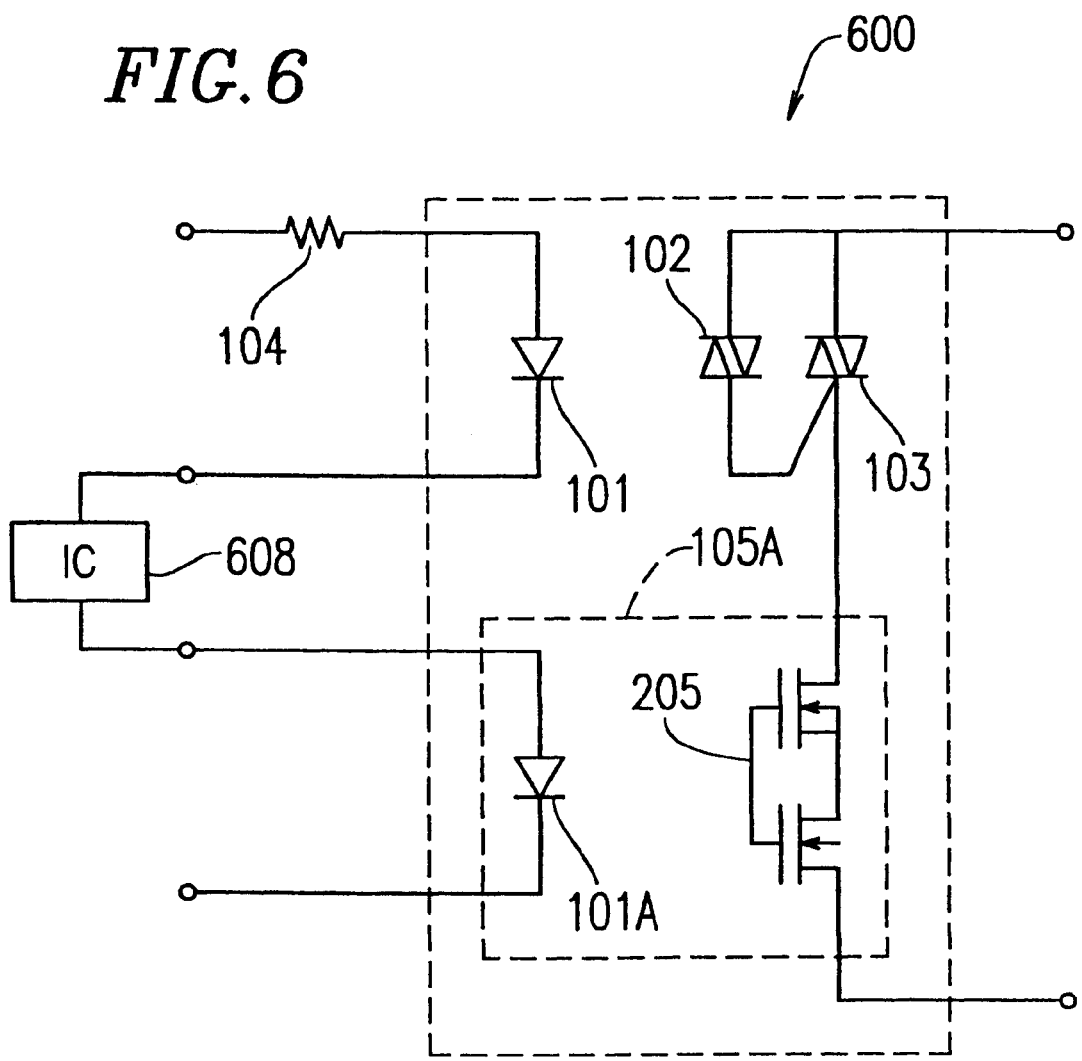
FIG. 6 is a structural diagram of a solid-state relay according to an embodiment of the present invention wherein a light emitting diode associated with a driving triac is coupled to a light emitting diode associated with a normally-on driving element via an IC having a delay function.

FIG. 6 illustrates a structure of a solid-state relay 600 according to an embodiment of the present invention, in which a light emitting diode 101 associated with a driving triac 103 is coupled to a light emitting diode 101A associated with a normally-on driving element 105A via an IC 608 having a delay function.

The normally-on driving element 105A coupled in series to the driving triac 103 includes the light emitting diode 101A and a normally-on MOSFET 205. The light emitting diode 101A controls the normally-on MOSFET 205.

The solid-state relay, 600 further includes the IC 608 coupled in series to the light emitting diode 101 and the light emitting diode 101A. The IC 608 has a delay function.

Therefore, when a phase control is performed, the solid-state relay 600 can maintain a stable on-state during the time delay provided by the Integrated circuit 608. Accordingly, it is possible to facilitate the design of the device by using the integrated circuit 608.

Figure 7:
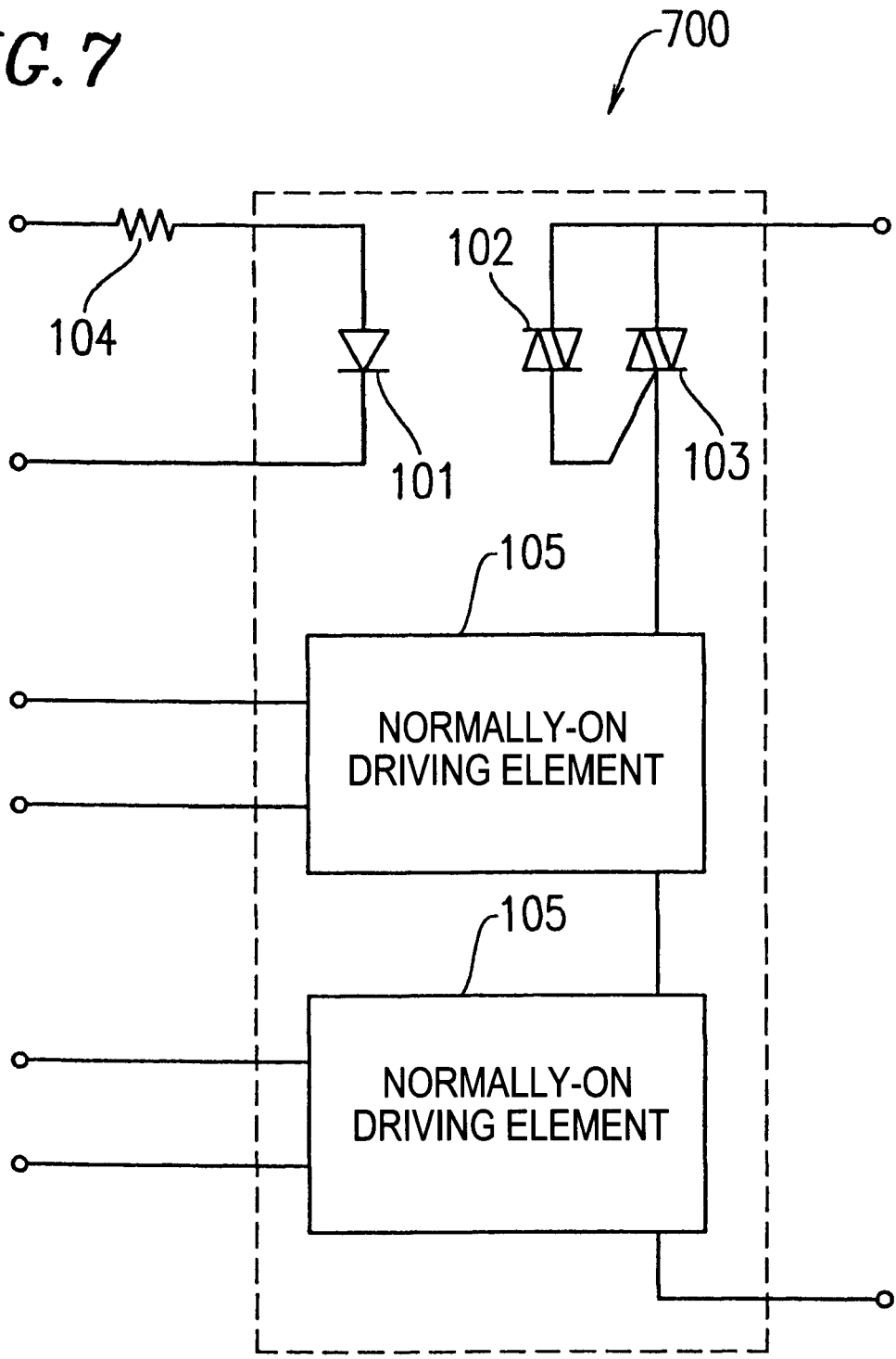
FIG. 7 is a structural diagram of a solid-state relay according to an embodiment of the present invention wherein a plurality of normally-on driving elements are coupled in series to a driving triac.

FIG. 7 illustrates a structure of a solid-state relay 700 according to an embodiment of the present invention in which a plurality of normally-on driving elements 105 are coupled in series to a driving triac 103.

The solid-state relay 700 includes the plurality of normally-on driving elements 105 coupled in series to the driving triac 103.

For example, as shown in FIG. 7, two normally-on driving elements 105 may be coupled in series to the driving triac 103. In this case, one of the normally-on driving elements 105 may be dedicated to the "off controlling" of the device, and the other may be dedicated to the compulsory shutting off of the device operation, at high temperatures, for example.

As a result, it is possible to realize a device which is capable of being controlled so as to be on/off with a predetermined timing and, moreover, it is possible to compulsorily turn off the solid-state relay 700 when the solid-state relay 700 is abnormally heated, for example.

Although the above embodiment illustrates an example in which two driving elements 105 are coupled together, the present invention is. not limited thereto. Three or more driving elements 105 may be coupled to the driving triac 103.

Although the above-described embodiments of the present invention illustrate examples directed to the solid-state relays, the present invention is not limited thereto. The present invention is applicable to any optocoupler which incorporates a thyristor or triac as a driving element, e.g., a photothyristor, a phototriac coupler, etc.

As described above, the present invention provides an optocoupler capable of preventing an increase in inrush current or commutation failure.

The present invention further provides an optocoupler whose off-timing can be controlled.

The present invention further provides an optocoupler capable of compulsorily turning itself off when an abnormality occurs, e.g., an ambient temperature rises to an extremely high level.

Accordingly, there is provided an optocoupler such as a solid-state relay, etc., which can be not only turned on, but also turned off, with a predetermined timing. Thus, when the optocoupler is employed for driving a load while performing a phase control, an increase in inrush current or commutation failure can be prevented. Moreover, it is possible to compulsorily turn off the device when an abnormality occurs, e.g., an ambient temperature rises to an extremely high level.

Various other modifications will be apparent to and can be readily made by those skilled in the art without departing from the scope and spirit of this invention. Accordingly, It in not intended that the scope of the claims appended hereto be limited to the description as set forth herein, but rather that the claims be broadly construed.

What is claimed is:

1. An optocoupler, comprising:
   a driving triac;
   at least one normally-on driving element coupled to an output of the driving triac;
   a load coupled to the driving triac and the normally-on driving element;
   a light emitting element for receiving a first input current for turning on the driving triac and a light receiving element for turning on the driving triac based on an output from the light emitting element so as to supply the load with a load current for driving the load; and
   means for turning off the normally-on driving element; wherein
      the first input current is applied to the light emitting element at a time when a phase of the load current is substantially at 0°; and
      a second input current is applied to the normally-on driving element at a time when a phase of the load current is substantially at 90°.

2. An optocoupler according to claim 1, wherein the optocoupler is constituted by a solid-state relay.

3. An optocoupler according to claim 1, wherein the normally-on driving element comprises a normally-on MOSFET.

4. An optocoupler according to claim 3, wherein:
   the means for turning off the normally-on driving element is a second light emitting element included in the driving element; and
   the second light emitting element turns off the normally-on MOSFET.

5. An optocoupler according to claim 4, wherein;
   the optocoupler further comprises temperature detecting means coupled to the second light emitting element, the temperature detecting means detecting an ambient temperature in a vicinity of the optocoupler; and
   the second input current is applied to the second light emitting element based on a detection result from the temperature detecting means.

6. An optocoupler according to claim 4, wherein:
   the optocoupler further comprises a resistance element coupled in series to the second light emitting element, the resistance element having a negative temperature coefficient; and
   the second input current is applied to the second light emitting element in response to a reduction in a resistance value of the resistance element.

7. An optocoupler according to claim 4, wherein;
   the driving element further includes an integrated circuit coupled to the first light emitting element and the second light emitting element; and
   the integrated circuit delays the second current relative to the first current by a predetermined time delay.

8. An optocoupler according to claim 1, wherein the driving element comprises a normally-on mechanical relay.

9. An optocoupler according to claim 8, wherein:
the means for turning off the normally-on driving element is a coil included in the driving element; and
the coil turns off the normally-on mechanical relay.

10. An optocoupler according to claim 1, wherein a timing of turning off the normally-on driving element is synchronized with a phase point substantially corresponding to 0 V level of a supply voltage on an output side of the optocoupler.

11. An optocoupler according to claim 1, wherein the optocoupler comprises a plurality of said normally-on driving elements.

* * * * *